United States Patent [19]

Han

[11] Patent Number: 5,077,518

[45] Date of Patent: Dec. 31, 1991

[54] SOURCE VOLTAGE CONTROL CIRCUIT

[75] Inventor: Gyo-Jin Han, Kyounggi, Rep. of Korea

[73] Assignee: SamSung Electronics Co., Ltd., Kyung Ki, Rep. of Korea

[21] Appl. No.: 636,509

[22] Filed: Dec. 31, 1990

[30] Foreign Application Priority Data

Sep. 29, 1990 [KR] Rep. of Korea ............... 1990-15678

[51] Int. Cl.$^5$ .................... G05F 1/565; G05F 3/24
[52] U.S. Cl. .................... 323/275; 307/296.8; 323/313; 323/280; 323/281; 323/303; 365/226
[58] Field of Search ............. 323/274, 275, 280, 281, 323/303, 313, 314; 307/296.8; 365/226

[56] References Cited

U.S. PATENT DOCUMENTS 4,716,307 12/1987 Aoyama ........................... 323/303
4,868,483 9/1989 Tsujimoto ......................... 323/313

OTHER PUBLICATIONS

Blumberg et al., "Voltage Reference Supply", IBM Tech. Discl. Bul., vol. 16, No. 3, pp. 1015, 1016, Aug. 1973.

"Voltage Regulator Power Reduction", IBM Tech. Discl. Bul., vol. 32, No. 12, pp. 216, 217, May 1990.

Primary Examiner—William H. Beha, Jr.
Attorney, Agent, or Firm—Robert E. Bushnell

[57] ABSTRACT

There is provided a source voltage control circuit including a reference voltage generating circuit with a negative feedback circuit, a source voltage level sensing circuit for increasing the internal source voltage when the external voltage exceeds a given voltage, a first differential amplifying circuit for active operation, and a second differential amplifying circuit for stand-by operation, whereby a stable internal source voltage is produced and the slope of the internal source voltage is readily adjusted when the external source voltage exceeds the given value. The first differential amplifying circuit receives the reference voltage and the internal source voltage, controlled by a first control signal and the output of the source voltage level sensing circuit. The second differential amplifying circuit receives the reference voltage and the internal source voltage, controlled by a second control signal.

25 Claims, 5 Drawing Sheets

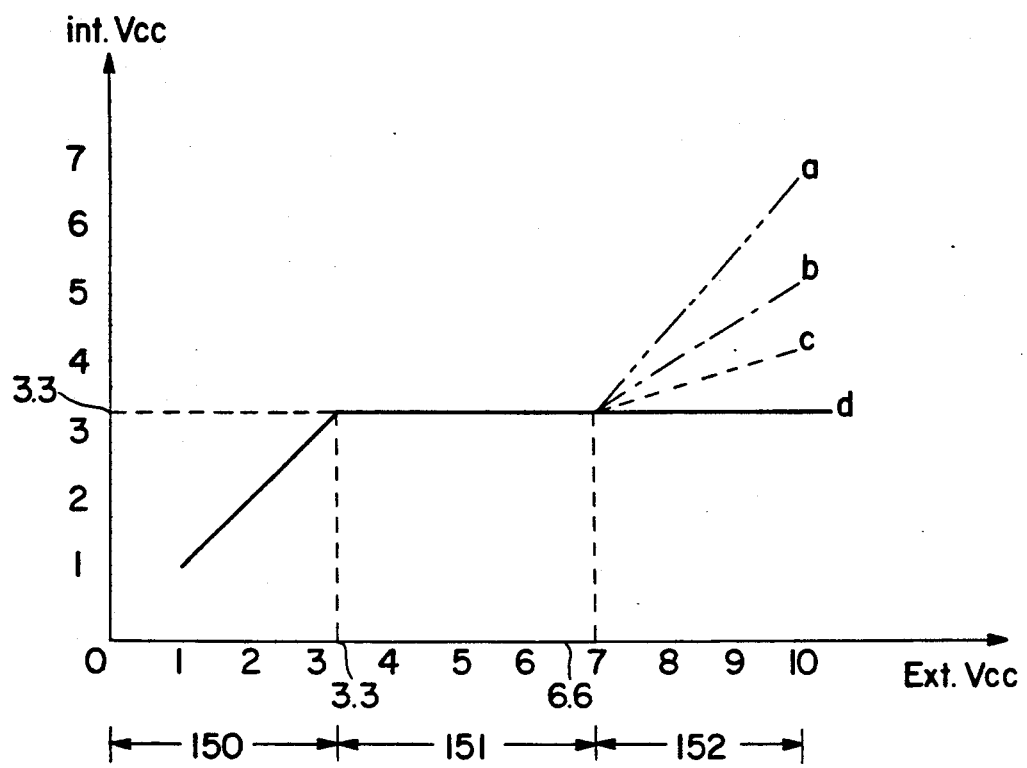
FIG.4
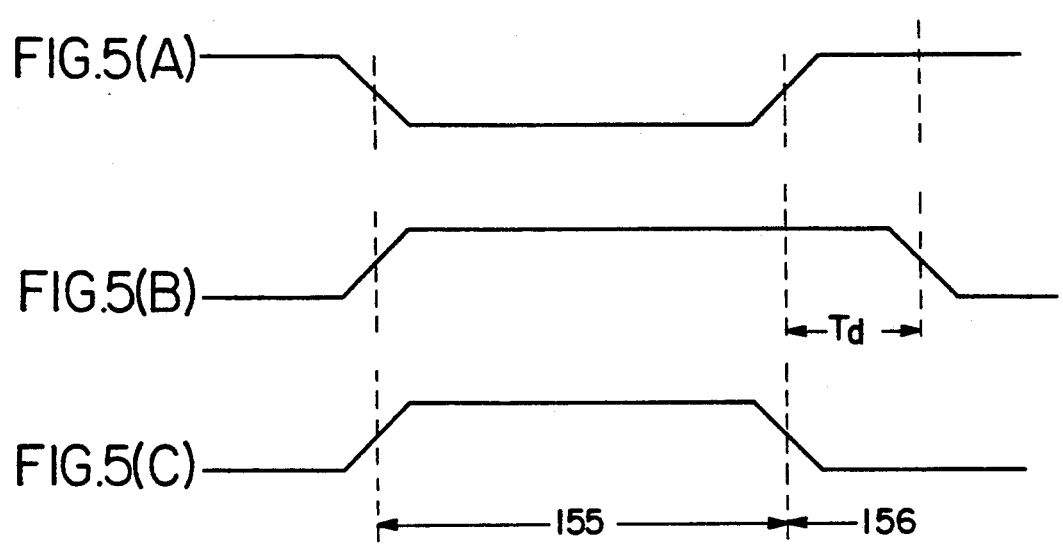

SOURCE VOLTAGE CONTROL CIRCUIT

TECHNICAL BACKGROUND

The present invention concerns a source voltage control circuit for use in a semiconductor memory device, and particularly a circuit for keeping a stable internal source voltage regardless of variation of an external source voltage and linearly increasing the internal source voltage when the external source voltage is equal to or greater than a specified value.

Recently, the semiconductor devices tend to be more and more highly integrated, so that in a semiconductor device of submicron order the reduction in the device area causes the corresponding increase of the voltage applied thereto, thus considerably affecting the reliability of the device.

For example, in a MOS (Metal Oxide Semiconductor) transistor much used for highly integrated semiconductor memory devices, although the external source voltage is maintained at constant value such as 5V, the channel length becomes shortened less than 1μm so that the drain voltage is increased. Accordingly, there occurs the punch-through phenomenon that the depletion layer near the drain extends to the source region. This phenomenon increases the leakage current between the source and drain so as to badly affect the operation of a fine MOS transistor of submicron order.

In addition, the internal field intensity increased according to the increase of the drain voltage appears in a depletion layer near the drain, so that some of the carriers get an additional energy, thus resulting in hot carrier effect that involves change of the threshold value caused by the carriers penetrating the gate oxide layer, increase of the substrate current caused by impinging ionization, deterioration of the device, etc.

In order to prevent the reliability of the semiconductor device from being degraded by the punch-through and hot carrier effect, the source voltage of 5V presently used as the standard source voltage or external source voltage must be necessarily dropped to 3.3V.

However, because the change of the voltage level of a system is two to three years slower than the change of a memory chip area, there is required, at the intermediate stage of the change, a source voltage control circuit for dropping the external source voltage to obtain the internal source voltage.

Referring to FIG. 1 for illustrating a conventional source voltage control circuit, the circuit includes a first and second single-ended N-channel input differential amplifiers 20 and 30 respectively with external input voltages V1 and V2, a feedback circuit 40 with inputs receiving the outputs of the first and second differential amplifiers 20 and 30 and a first output applied to the other input terminals of the first and second differential amplifiers 20 and 30, and a third differential amplifier 50 with a positive input terminal connected to a first output node 47 of the feedback circuit 40 and a negative input terminal connected to the output 51 thereof.

The first and second differential amplifiers 20, 30 include first NMOS transistors 23, 34 with the gates respectively connected to the input voltages V1 and V2, second NMOS transistors 24, 33 with the gates commonly connected to the second output node 48 of the feedback circuit 40, separate current sources 25, 35 respectively connected between the sources of the first and second NMOS transistors 23 and 24, 33 and 34 and ground voltage terminal, first and second PMOS transistors 21 and 22, 31 and 32 connected to external source voltage terminal, and output nodes 26, 36 between the first PMOS transistors 21, 32 and the first NMOS transistors 23, 34.

The feedback circuit 40 includes a third and fourth PMOS transistors 41 and 42 with the channels connected between the external source voltage terminal and a first output node 47 and the gates respectively connected to the outputs of the first and second differential amplifiers 20 and 30, a first resistor 45 connected between the first output node 47 and a second output node 48 commonly connected to the gates of the second NMOS transistors 24, 33 of the first and second differential amplifiers 20 and 30, and a second resistor 46 connected between the second output node 48 and ground voltage terminal. The feedback circuit 40 produces a reference voltage Vref at the first output node 47 between the second PMOS transistors 41, 42 and the first resistor 45, and feeds back the voltage divided by the first and second resistors 45 and 46 to the other inputs of the first and second differential amplifiers 20 and 30.

The third differential amplifier 50 receives the reference voltage Vref from the feedback circuit 40 through the positive input, thus producing internal source voltage that is equal to the reference voltage Vref.

FIG. 2 is a graph for illustrating the internal source voltage against the external source voltage according to the conventional source voltage control circuit.

The horizontal axis represents the external source voltage, and the vertical axis the internal source voltage. There is shown the internal source voltage "c" according to the change of the two input voltages a and b. For descriptive convenience, the external source voltage is divided into three intervals which include the first interval 60 below 3.3V, the second interval 61 from 3.3V to 6.6V, and the third interval 62 over 6.6V.

The operation of the conventional source voltage control circuit will now be described with reference to FIGS. 1 and 2.

The first and second differential amplifiers 20 and 30 receive the externally applied voltages V1 and V2 respectively through the gates of the first NMOS transistors 23 and 34, and the voltage $$\frac{R2}{(R1 + R2)} \times Vref$$

divided by the first and second resistors 45 and 46 through the gates of the second NMOS transistors 24, 33. Thus, one of the NMOS transistors that receives more higher voltage is more turned on producing an output of "low" or "high" state at the output nodes 26, 36.

The outputs at the output nodes 26, 36 control the current pass capability of the third and fourth PMOS transistors 41, 42 so as to produce a desired reference voltage Vref at the first output node 47.

When the external source voltage is within the first interval 60 below 3.3V, one input voltage V1 of the first differential amplifier 20 is greater than one input voltage V2 of the second differential amplifier 30 as shown in FIG. 2. Accordingly, until the other input voltage $$\frac{R2}{R1 + R2} \times Vref$$

becomes equal to the input voltage V1, the first NMOS transistor 23 of the first differential amplifier 20 is turned on so as to turn on the third PMOS transistor 41 of the feedback circuit 40. Thus, the reference voltage Vref from the first output node 47 is increased in proportion to the externally applied source voltage.

Meanwhile, when the external source voltage is within the second interval 61 of 3.3V to 6.6V, the one input voltage V1 of the first differential amplifier 30 is greater than the one input Voltage V2 of the second differential voltage 30. Accordingly, until the other input voltage $$\frac{R2}{R1 + R2} \times Vref$$

of the first and second differential amplifier 20, 30 becomes equal to the one input voltage V1 of the first differential amplifier 20, the first differential amplifier 20 keeps on operating. Hence, the reference voltage Vref equals to (R1 + R2/R2).V1. In this case, because the voltage V1 is constant, the reference voltage Vref becomes to have a constant value regardless of the increase of the external source voltage. Thus, the internal source voltage Int Vcc has a constant value of 3.3V.

When the external source voltage is within the third interval 62 over 6.6V, the one input voltage V2 of the second differential amplifier 30 becomes greater than the one input voltage V1 of the first differential amplifier 20. Accordingly, until the other input voltage $$\frac{R2}{R1 + R2} \times Vref$$

of the first and second differential amplifier 20, 30 becomes to equal the one input voltage V2 of the second differential amplifier 30, the second differential amplifier 30 keeps on operating as the main differential amplifier. In this case, the reference voltage Vref is proportional to V2 so as to be increased with a constant slope according to the increase of V2.

As described above, it is very important to increase the internal source voltage for the reliability of a semiconductor device when the external voltage gets over a specified value (6.6V), and the limit of the internal source voltage depends on the whole characteristics of the semiconductor memory device. Hence, the slope of the internal source voltage should be readily adjusted when the external source voltage gets over a specified value.

However, in order to adjust the slope of the internal source voltage according to the conventional source voltage control circuit, it is necessary to change both of the input voltages V1 and V2 of the first and second differential amplifiers 20 and 30 and the first and second resistors 45 and 46 of the feedback circuit 40, thereby resulting in difficulty.

Further, the current consumed by the reference voltage generating circuit 10 of the conventional source voltage control circuit during the stand-by is the sum of the current flowing through the first and second resistors 45 and 46 of the feedback circuit 40 and the current resulting from the input voltages V1 and V2 of the first and second differential amplifiers 20 and 30. Hence, although the stand-by consuming current of a semiconductor memory device should be maintained very small, it becomes very large because the conventional reference voltage generating circuit itself includes a differential amplifier.

SUMMARY OF THE INVENTION

It is an object of the present invention to provide a source voltage control circuit for readily adjusting the slope of the internal source voltage when the external source voltage gets over a specified value.

It is another object of the present invention to provide a source voltage control circuit for minimizing the stand-by consuming current.

According to the present invention, a source voltage control circuit includes:

a reference voltage generating circuit with a negative feedback circuit connected to an external source voltage terminal;

a source voltage level sensing circuit connected to the external source voltage terminal for increasing internal source voltage when the external source voltage is equal to or greater than a given voltage;

a first differential amplifying circuit with two inputs consisting of the output of the reference voltage generating circuit and the internal source voltage controlled by a first control signal and the source voltage level sensing circuit, the output of the first differential amplifying circuit being connected to an internal source voltage terminal; and a second differential amplifying circuit with two inputs consisting of the output of the reference voltage generating circuit and the internal source voltage controlled by a second control signal, the output of the second differential amplifying circuit being connected to the internal source voltage terminal.

The present invention will now be described more specifically with reference to the drawings attached only by way of example.

BRIEF DESCRIPTION OF THE ATTACHED DRAWINGS

For a better understanding of the invention and to show how the same may be carried into effect, reference will now be made, by way of example, to the accompanying diagrammatic drawings, in which:

FIG. 4 is a graph for illustrating an internal source voltage against an external source voltage according to the present invention;

FIG. 5 is a timing diagram according to the present invention; and

DETAILED DESCRIPTION OF CERTAIN PREFERRED EMBODIMENTS

Figure 1:
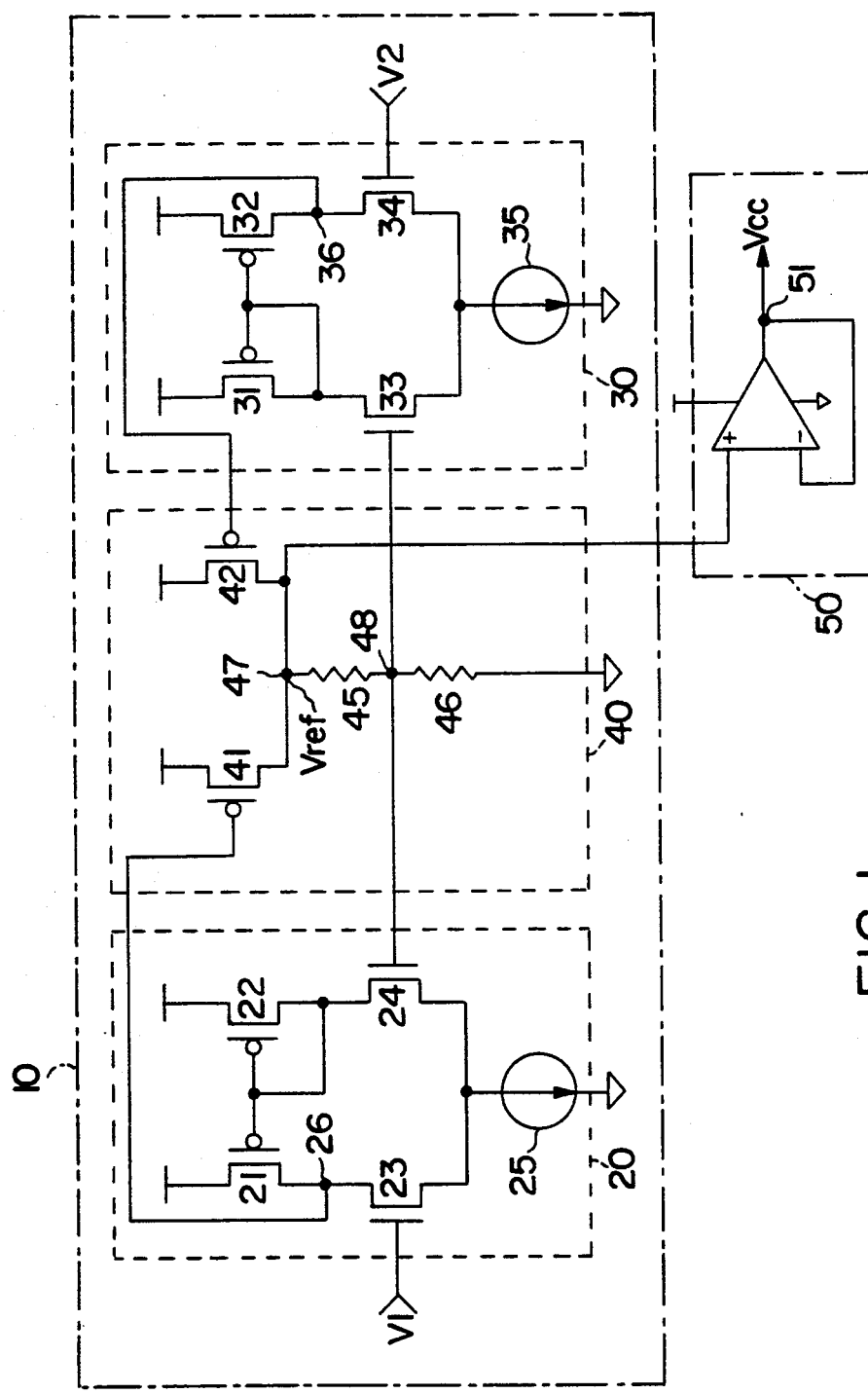
FIG. 1 is a conventional circuit diagram.
Figure 2:
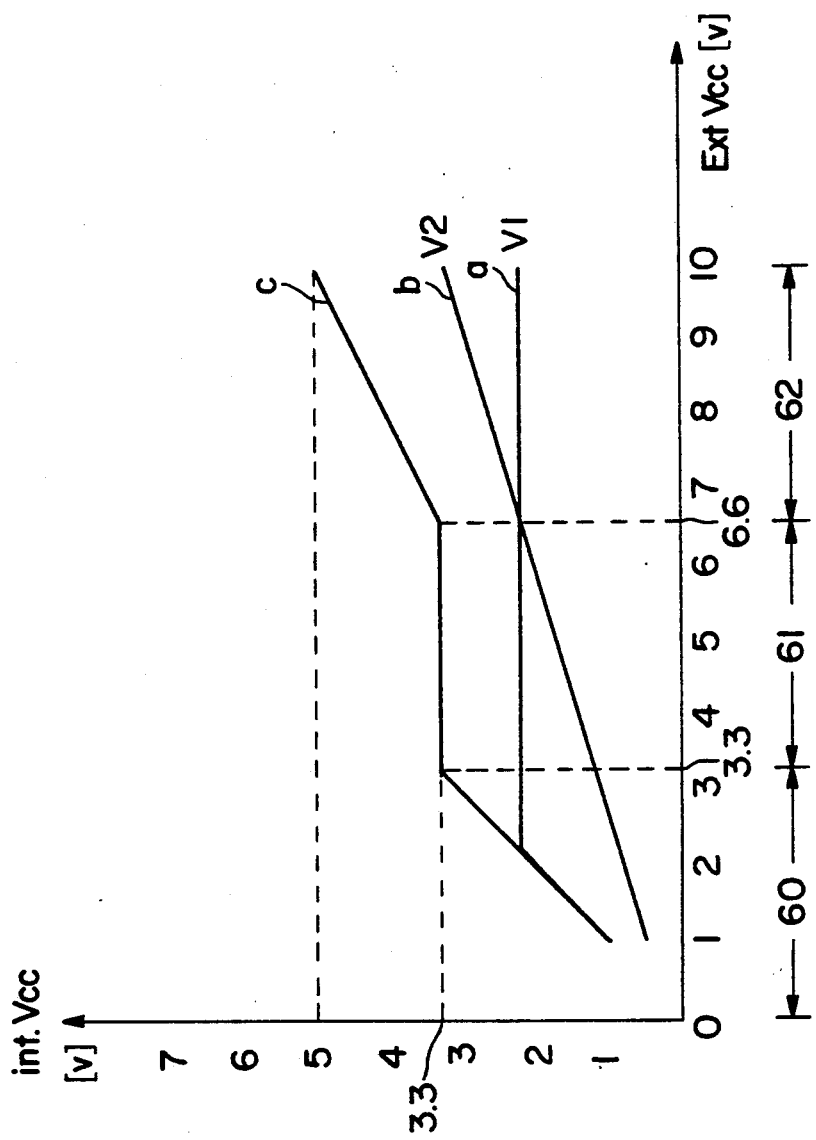
FIG. 2 is a graph for illustrating a reference voltage against an external source voltage according to FIG. 1.
Figure 3:
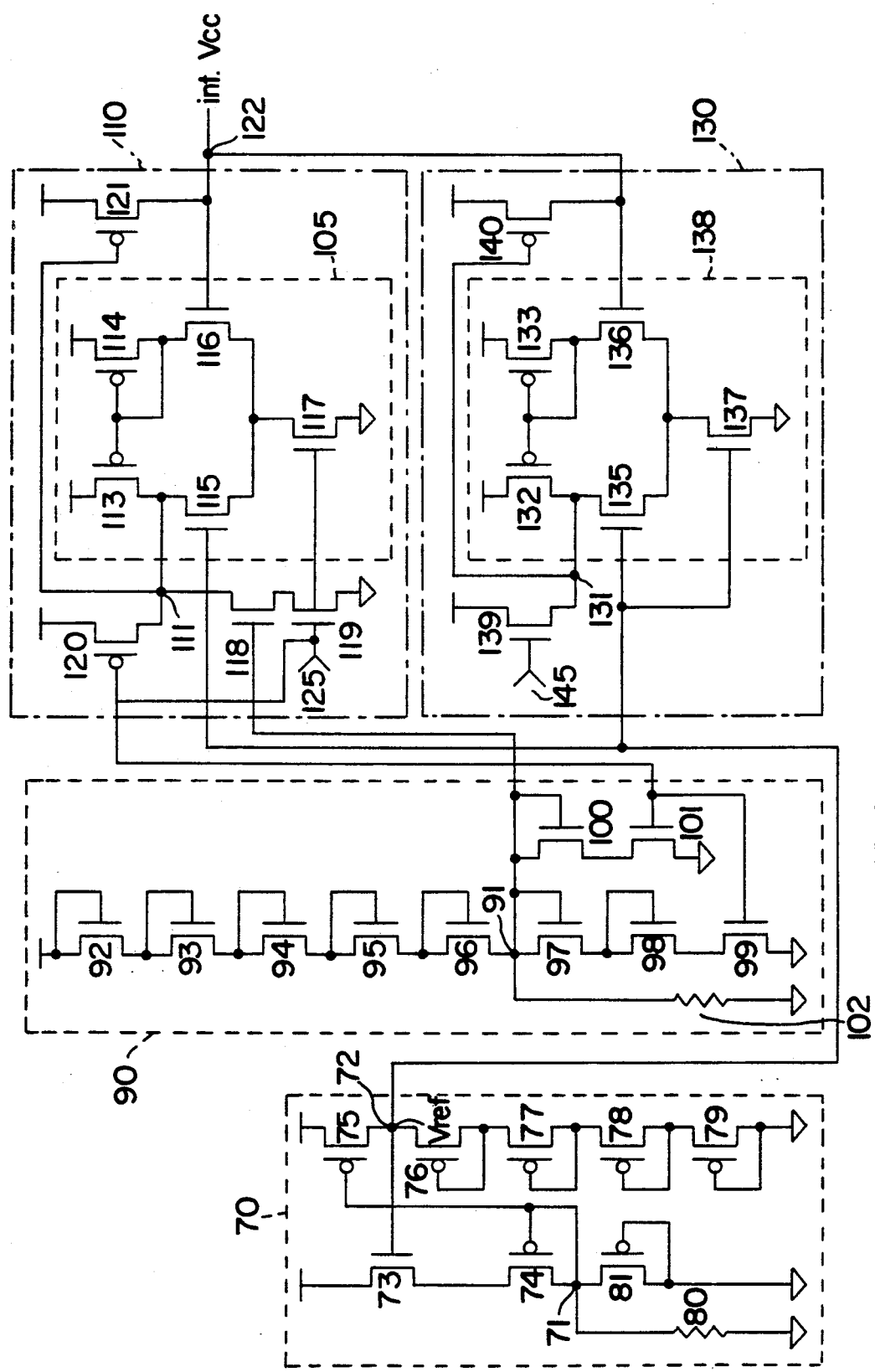
FIG. 3 is the inventive circuit diagram.

Referring to FIG. 3 for illustrating a source voltage control circuit according to present invention, there are shown a reference voltage generating circuit 70, source voltage level sensing circuit 90, a first differential amplifying circuit 110 and a second differential amplifying circuit 130. The first differential amplifying circuit 110 receives two inputs consisting of the output voltage Vref of the reference voltage generating circuit 70 and the internal source voltage Int Vcc, controlled by a first control signal 125 and the source voltage level sensing circuit 90. The output of the first differential amplifying circuit 110 is connected to an internal source voltage terminal 122. The second differential amplifying circuit 130 receives two inputs consisting of the output voltage of the reference voltage generating circuit 70 and the internal source voltage, controlled by a second control signal 145. The output of the second differential amplifying circuit is connected to the internal source voltage terminal 122.

The reference voltage generating circuit 70 includes a plurality of transistors. The channels of a first NMOS transistor 73 and first PMOS transistor 74 are connected in series between the external source voltage terminal and a control node 71. Between the control node 71 and ground voltage terminal is connected in parallel a resistor 80 and second diode-connected PMOS transistor 81. There is provided a driving PMOS transistor 75 with the channel connected between the external source voltage terminal and the output node 72 and the gate connected to the control node 71. There are also provided a plurality of third to sixth diode-connected PMOS transistors 76-79 connected in series between the output node 72 and the ground voltage terminal. The gate of the first NMOS transistor 73 is connected to the output node 72, and the gate of the first PMOS transistor 74 to the control node 71.

The reference voltage generating circuit 70 always generates a constant reference voltage Vref by controlling the gate voltage of the driving PMOS transistor 75 according to the voltage of the control node 71. The output node 72 is connected to the gate of the first NMOS transistor 73 so as to feed back the reference voltage Vref. Thus, the voltage of the control node 71 is controlled according to the changes of the reference voltage which in turn is caused by the changes of the parameters such as temperature, etc., so that the current pass capability of the driving PMOS transistor 75 may be adjusted.

The driving PMOS transistor 75 serves to charge the output node 72. The second PMOS transistor 81 serves as a pulldown transistor with a gate connected to the ground voltage terminal. Thus, when the external source voltage exceeds the threshold voltage of the first NMOS transistor 73 and the first and second PMOS transistor 74 and 81, the second PMOS transistor 81 is turned on to have the characteristics of a resistor.

The source voltage level sensing circuit 90 includes a first group of diode-connected NMOS transistors 92-96 connected in series between the external source voltage terminal and a sensing node 91. A resistor 102 is connected between the sensing node 91 and the ground voltage terminal. There are provided a second group of diode-connected NMOS transistors 97, 98 connected in series to the sensing node 91. There is also provided a second NMOS transistor 99 with the channel connected between the NMOS transistor 98 and the ground voltage terminal and the gate connected to the first control signal 125. A third NMOS transistor 100 has the gate and drain connected to the sensing node 91. A fourth NMOS transistor 101 has the channel connected between the source of the third NMOS transistor 100 and the ground voltage terminal and the gate connected to the first control signal 125.

The first group of diode-connected NMOS transistors 92-96 serve to detect the external source voltage level so as to drop the external source voltage by the threshold voltage proportional to the number of the NMOS transistors. The dropped external source voltage is applied to the sensing node 91.

The first differential amplifying circuit 110 includes a first single-ended N-channel input differential amplifier 105 consisting of a seventh and eighth PMOS transistors 113 and 114 and a fifth to seventh NMOS transistors 115, 116 and 117. There is also provided a ninth PMOS transistor 120 with the channel connected between the output node 111 of the first differential amplifier 105 and the external source voltage terminal and the gate connected to the first control signal 125. An eighth and ninth NMOS transistors 118 and 119 are connected in series between the output node 111 and the ground voltage terminal with the gates respectively connected to the sensing node 91 of the source voltage level sensing circuit 90 and the first control signal 125. A tenth PMOS transistor 121 is provided with the gate connected to the output node 111 and the channel connected between the external source voltage terminal and internal source voltage terminal 122.

The gate of the seventh NMOS transistor 117 is supplied with the first control signal 125. The two inputs of the first differential amplifier 105 are the gate of the fifth NMOS transistor 115 connected to the output node 72 of the reference voltage generating circuit 70 and the gate of the sixth NMOS transistor 116 connected to the internal source voltage terminal 122.

The second differential amplifying circuit 130 includes a second single-ended N-channel input differential amplifier 138 consisting of an eleventh and twelfth PMOS transistors 132 and 133 and a tenth to twelfth NMOS transistors 135, 136 and 137. There is also provided a thirteenth NMOS transistor 139 with the channel connected between the external source voltage terminal and the output node 131 of the second differential amplifier 138 and the gate connected to a second control signal 145. A thirteenth PMOS transistor 140 is also provided with the channel connected between the external source voltage terminal and the internal source voltage terminal 122 and the gate connected to the output node 131.

The second differential amplifier 138 has two inputs consisting of the gate of the tenth NMOS transistor 135 connected to the output node 72 of the reference voltage generating circuit 70 and the gate of the eleventh NMOS transistor 136 connected to the internal source voltage terminal 122. The gate of the twelfth NMOS transistor 137 and the gate of the tenth NMOS transistor 135 are commonly connected to the output node 72 of the reference voltage generating circuit 70.

Referring to FIG. 4, there is shown a graph for illustrating the reference voltage against the changes of the externally applied source voltage. The horizontal axis represents the external source voltage and the vertical axis the internal source voltage. The reference letters a, b, c indicate the internal source voltages having different slopes from each other, while d indicates the standby internal source voltage which is at the same time the reference voltage of the reference voltage generating circuit.

With reference to the desired value 3.3V and a specified value 7V of the internal voltage, the external source voltage is divided into three intervals of which the first interval 150 is below 3.3V, the second interval 151 is from 3.3V to 7V and the third interval 152 is over 7V.

In FIG. 5, A shows a timing diagram for external chip selection signal, B a timing diagram for the first control signal applied to the first differential amplifying circuit and C a timing diagram for the second control signal applied to the second differential amplifying circuit.

When the external chip selection signal A is in "low" state, the first control signal B becomes "high" state so as to enable the first differential amplifying circuit 110, so that the source voltage control circuit gets into the active period 155. On the other hand, when the external chip selection signal A is in "high" state, the second control signal C becomes "low" state so as to enable the second differential amplifying circuit 130, so that the source voltage control circuit gets into the stand-by period 156.

The operation of the inventive circuit will now be described in detail with reference to FIGS. 3, 4 and 5.

When the external source voltage is with the first interval 150, namely, smaller than the desired value 3.3V, the gate of the driving PMOS transistor 75 makes a complete connection with the ground by way of the resistor 80 of the reference voltage generating circuit 70. Accordingly, the driving PMOS transistor 75 is completely turned on, so that the reference voltage Vref of the output node 72 depends on the external source voltage Vcc.

If the external source voltage gradually increases and gets into the second interval 151, the gate voltage of the driving PMOS transistor 75 is increased by the current flowing through the resistor 80 and second PMOS transistor 81. Accordingly, the current pass capability of the driving PMOS transistor 75 is lowered, so that the reference voltage Vref of the output node 72 maintains a constant value of 3.3V regardless of the increase of the external voltage.

Namely, as the external source voltage increases over 3.3V, the current pass capability of the driving PMOS transistor 75 is correspondingly lowered, so that the reference voltage Vref of the output node 72 maintains a constant value of 3.3V as shown in FIG. 4(d).

On the other hand, if the reference voltage Vref suffers a variation due to temperature or other parameters, the variation is fed back from the output node 72 to the gate of the first NMOS transistor 73, and again negatively fed back through the first PMOS transistor 74 to the driving PMOS transistor 75, thus minimizing the variation of the reference voltage Vref.

Namely, when the reference voltage is increased over the desired value, the high voltage applied to the gate of the first NMOS transistor 73 causes the first NMOS transistor 73 to be more turned on. Accordingly, the voltage applied to the control node 71 is increased so as to lower the current pass capability of the driving PMOS transistor 75, so that the reference voltage of the output node 72 maintains a constant value.

Likewise, the same operating principle is applied to the case when the reference voltage is decreased below the desired value. The constant reference voltage of the output node 72 serves as first input of the first and second differential amplifying circuit 110, 130, and in the active operation, the first control signal 125 in "high" state causes the first differential amplifying circuit 110 to be operated. In the stand-by operation, the second control signal 145 in "low" state causes the second differential amplifying circuit 130 to be operated.

In the active operation, as the first control signal 125 gets into "high" state, the seventh NMOS transistor 117 of the first differential amplifier 105 is turned on so as to enable the first differential amplifier 105. On the other hand, the ninth PMOS transistor 120 is turned off by the first control signal 125 in "high" state, so as to turn on the first differential amplifying circuit 110.

If the external source voltage is within the first interval 150 of FIG. 4, the fifth NMOS transistor 115 of the first differential amplifier 105 is more and more turned on in proportion to the increase of the reference voltage of the output node 72. Accordingly, the voltage level of the output node 111 of the first differential amplifier 105 is gradually lowered so as to increase the current pass capability of the tenth PMOS transistor 121, so that there is obtained the internal voltage in proportion to the external source voltage applied to the source of the tenth PMOS transistor 121.

Further, if the external source voltage is within the second interval 151 of FIG. 4, a constant reference voltage is applied to the gate of the fifth NMOS transistor 115 of the first differential amplifier 105, so that the current flowing through the fifth and sixth NMOS transistors 115 and 116 is maintained constant. Thus, a constant voltage is applied to the gate of the tenth PMOS transistor 121, so that even if the external source voltage is increased, the constant current pass capability causes the stable internal voltage.

Although the semiconductor memory device should keep a stable internal source voltage in a normal mode regardless of the external source voltage variation, it is necessary to increase the internal source voltage in order to test the reliability of the semiconductor device over a specified value of the external source voltage.

In the present embodiment, when the external source voltage exceeds 7V, the internal source voltage is caused to increase. When the external source voltage is within the third interval 152 of FIG. 4 exceeding 7V, the voltage of the sensing node 91 of the source voltage level sensing circuit 90 has a value enough to turn on the eighth NMOS transistor 118 connected to the sensing node 91.

Hence, the current at the output node 111 of the first differential amplifier 105 flows into the fifth NMOS transistor 115 as well as the eighth and ninth NMOS transistors 118 and 119, so that the tenth PMOS transistor 121 with the gate connected to the output node 111 is more and more turned on. Thus, the internal voltage terminal 122 has the linearly increased source voltage.

Meanwhile, if the slope of the internal voltage is to be adjusted over a specified value of the external voltage in the light of the characteristics of each of the semiconductor memory chips, it is only required to change the size of the eighth NMOS transistor 118 whose current pass capability depends on the voltage of the sensing node 91, thereby much facilitating the adjustment compared to the conventional source voltage control circuit.

In the second differential amplifying circuit 130, the second control signal 145 disabled into "high" state causes the thirteenth NMOS transistor 139 to be turned on. Consequently, the output node 131 of the second differential amplifier 138 is freely charged with Vcc-$V_{TN}$ ($V_{TN}$ is the threshold voltage of the NMOS transistor), so that the thirteenth PMOS transistor 140 is maintained turned off. Thus, it is prevented that the internal source voltage caused by the operation of the first differential amplifying circuit 110 is fed back through the thirteenth PMOS transistor 140 to the second differential amplifying circuit 130. Here, the second differential amplifying circuit 130 has a very small size compared to the first amplifying circuit 110 in order to minimize the stand-by consuming current, thus having a very slow response speed of a few μsec.

If the internal source voltage is increased due to a certain factor, the sixth NMOS transistor 116 of the first differential amplifying circuit 110 is turned on, s that the output of the output node 111 becomes "high" state. Accordingly, the tenth PMOS transistor 121 is turned off, thus preventing the internal source voltage from more increasing.

In the mean time, the second differential amplifying circuit 130 requires a certain delay time to be completely turned on because the response speed of the eleventh NMOS transistor 136 is slow. At this time, if there does not exist the thirteenth NMOS transistor 139, the output of the output node 131 is maintained "low" state during the delay time, so as to turn on the thirteenth PMOS transistor 140. Therefore, the phenomenon may occur that the internal source voltage increases according to the increase of the external source voltage.

However, the inventive circuit introduces the thirteenth NMOS transistor 139 to be turn on in the active operation to turn off the thirteenth PMOS transistor 140. Thus, only the first differential amplifying circuit 110 is operated in the active operation.

Next, in the stand-by operation of the source voltage control circuit, the second control signal 145 of the chip selection buffer is changed from "high" state to "low" state, so that the thirteenth NMOS transistor 139 of the second differential amplifying circuit 130 is turned off. Accordingly, when the external source voltage is within the second interval in the active operation, the second differential amplifying circuit becomes to have the same structure as the first differential amplifying circuit 110, thus maintaining a stable internal voltage based on the same operating principle. Furthermore, even if the external source voltage exceeds a specified value 7V, the current pass capability of the thirteenth PMOS transistor 140 is always maintained constant because there is no other current pass circuit such as the eighth NMOS transistor 118 of the first differential amplifying circuit 110. Therefore, even if the external source voltage continues to increase over a specified value (7V), the internal voltage is maintained at a stable voltage of 3.3V.

Meanwhile, in the first differential amplifying circuit 110, as the first control signal 125 of the chip selection buffer is disabled into "low" state, the ninth PMOS transistor 120 is turned on. Thus, the external source voltage Vcc is directly applied to the gate of the tenth PMOS transistor 121 thereby turning off the first differential amplifying circuit 110.

Moreover, as shown in FIG. 5, passing from the active period 155 to the stand-by period 156, the first control signal A directly passes from "low" state into "high" state, but the second control signal B passes from "high" state through a given delay time Td into "low" state. Thus, even while all the signals within the semiconductor memory device are disabled, the first differential amplifying circuit 110 is more operated during the delay time Td so as to prevent the dropping of the internal voltage due to the consuming current. Therefore, there is obtained a stable operation both in the stand-by operation and in the active operation.

Figure 6:
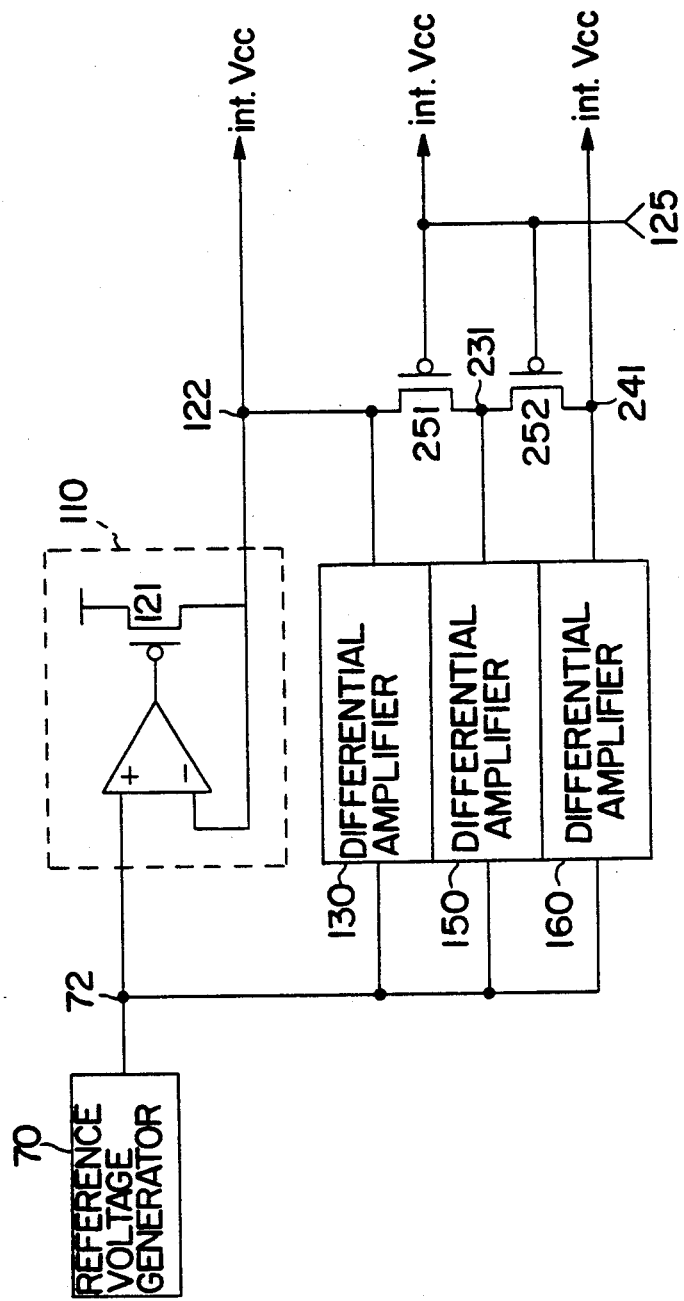
FIG. 6 is an embodiment of the present invention.

Referring to FIG. 6, there is shown a block diagram for illustrating the reference voltage generating circuit, and the first and second differential amplifying circuits, according to the present invention. The same reference numerals as in FIG. 3 are used for the same parts. The first and second differential amplifying circuits are respectively used for the active and stand-by operations.

There are provided a first, second, third differential amplifying circuit 110, 150, 160 for the active operation and a differential amplifying circuit 130 for the stand-by operation, each being connected between the output node 72 of the reference voltage generating circuit 70 and the internal source voltage terminals 122, 231, 241, respectively. A first PMOS transistor 251 is provided with the channel connected between the internal source voltage terminals 122 and 231 and the gate connected to the first control signal 125. A second PMOS transistor 252 is provided with the channel connected between the internal source voltage terminals 231 and 241 and the gate connected to the first control signal 125.

The output terminal of the differential amplifying circuit 130 for the stand-by operation is connected to the internal source voltage terminal 122 of the first differential amplifying circuit 110 for the active operation.

In a conventional memory device, in order to prevent noises and to improve the reliability, there has been proposed a source voltage control circuit wherein differential amplifiers are separated according to each of the internal source lines. However, this circuit causes the problem that there is resulted in as large a stand-by current as the number of the stand-by differential amplifiers.

In the present invention, the first and second PMOS transistors 251 and 252 with the gates connected to the first control signal 125 of the chip selection buffer are employed to connect each of the internal source lines in order to prevent noises and to improve the reliability.

Thus, in the active operation, the first and second PMOS transistors 251 and 252 are turned off by the first control signal 125 of "high" state, so that the internal source lines are separated from each other. In the stand-by operation, as the first control signal 125 is changed into "low" state to turn on the first and second PMOS transistors 251 and 252, thereby connecting the internal source lines with each other. Therefore, in the active operation are separated the internal source lines from each other so as to prevent noises and to improve reliability, while in the stand-by operation are connected the internal source lines with each other so as to minimize the stand-by current.

As described above, according to the inventive source voltage control circuit, an NMOS transistor 118 with the gate connected to the sensing node 91 of the source voltage level sensing circuit 90 is connected to the output node 111 of the first differential amplifier 110 with an input receiving the reference voltage Vref, so that in the case that the external source voltage over a specified value is applied, the current pass capability of the NMOS transistor is increased so as to linearly increase the internal source voltage.

Hence, in order to adjust the slope of the internal source voltage over a specified external source voltage, it is necessary to change one input voltages of the two differential amplifiers and the first and second resistors in the conventional circuit, but the inventive circuit only requires the size of the NMOS transistor to be adjusted. Thus, the slope of the internal voltage may be very easily adjusted.

Further, the conventional source voltage control circuit requires the reference voltage generating circuit to include a differential amplifier which consumes a large current, but the reference voltage generating circuit of the inventive circuit is not a differential amplifier and is always made to have a constant voltage, thereby considerably reducing the stand-by consuming current.

In addition, the inventive circuit negatively feeds back the reference voltage to the reference voltage generating circuit, thus minimizing the variation of the reference voltage due to temperature or other parameters.

Moreover, according to the present invention, the internal source lines are connected by PMOS transistors, so that the internal source lines can be separated from each other in the active operation, and all connected with each other in the stand-by operation. Accordingly, the noises of the semiconductor are prevented, the reliability thereof improved, and the standby current minimized.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A source voltage control circuit comprising:
   reference voltage generating means connected to an external source voltage terminal for generating a constant reference voltage;
   source voltage level sensing means connected to said external source voltage terminal for linearly increasing internal voltage when said external source voltage is equal to or greater than a given voltage;
   first deferential amplifying means with two inputs receiving respectively the outputs of said reference voltage generating means and of said internal source voltage controlled by a first control signal and the output of said source voltage level sensing means; and
   second differential amplifying means with two inputs receiving the outputs of said reference voltage generating means and said internal source voltage controlled by a second control signal.

2. A source voltage circuit control circuit as claimed in claim 1, wherein said reference voltage generating means comprises:
   a first NMOS transistor and diode-connected PMOS transistor connected in series between said external source voltage and a control node;
   a resistor and pull-down PMOS transistor connected in parallel between said control node and ground voltage terminal;
   an output node connected to the gate of said first NMOS transistor; and
   a driving PMOS transistor with the channel connected between said external source voltage terminal and said output node and the gate connected to said control node.

3. A source voltage control circuit as claimed in claim 2, wherein said reference voltage generating means further comprises a current path means including a plurality of diode-connected PMOS transistors connected between said output node and ground voltage terminal.

4. A source voltage control circuit as claimed in claim 1, wherein said source voltage level sensing means comprises:
   voltage drop means connected in series between said external source voltage terminal and a sensing node;
   a resistor connected between said sensing node and ground voltage terminal;
   diode-connected NMOS transistors connected in series to said sensing node;
   a second NMOS transistor with the channel connected between said transistor and ground voltage terminal and the gate connected to said first control signal;
   a third diode-connected NMOS transistor connected to said sensing node; and
   a fourth NMOS transistor with the channel connected between the source of said third NMOS transistor and ground voltage terminal and the gate connected to said first control signal.

5. A source voltage control circuit as claimed in claim 1, wherein said first differential amplifying means comprises:
   a first singly-ended N-channel input differential amplifier with two inputs receiving the voltage of the output node of said reference voltage generating means and said internal source voltage;
   a fifth PMOS transistor with the channel connected between said external voltage terminal and the output node of said first differential amplifier and the gate connected to said first control signal;
   an eight and ninth NMOS transistors with the channels connected in series between said output node and ground voltage terminal and the gates respectively connected to said sensing node and said first control signal; and
   a sixth PMOS transistor with the channel connected between said external source voltage terminal and said internal source voltage and the gate connected to said output node.

6. A source voltage control circuit as claimed in claim 5, wherein said first differential amplifier is controlled by said first control signal.

7. A source voltage control circuit as claimed in claim 1, wherein said second differential amplifying means comprises:
   a second single-ended N-channel input differential amplifier with two input receiving the voltage of the output node of said reference voltage generating means and said internal source voltage;
   a thirteenth NMOS transistor with the channel connected between said external source voltage terminal and the output node of said second differential amplifier and the gate connected to said second control signal; and
   a ninth PMOS transistor with the gate connected to said output node and the channel connected between said external source voltage terminal and internal source voltage terminal.

8. A source voltage control circuit as claimed in claim 7, wherein said second differential amplifier is controlled by the output of said reference voltage generating means.

9. A source voltage control circuit as claimed in claim 1, wherein said first differential amplifying means is enabled by said first control signal of "high" state so as to perform active operation, while said second differential amplifying means ius enabled by said second control signal of "low" state so as to perform stand-by operation.

10. A source voltage control circuit as claimed in claim 5, wherein said source voltage control circuit is changed form the active mode to the stand-by mode after a given delay time of said first control signal.

11. A source voltage control circuit comprising:
reference voltage generating means comprising:
a first NMOS transistor and diode-connected PMOS transistor with the channels connected in series between external source voltage terminal and ground voltage terminal,
an output node connected to the gate of said first NMOS transistor, and
a driving PMOS transistor with the channel connected between said external source voltage terminal and output node and the gate connected to the gate of said PMOS transistor;
first differential amplifying means comprising:
a first single-ended N-channel input differential amplifier with two inputs receiving the reference voltage of said output node and internal source voltage,
a PMOS transistor with the channel connected between said external source voltage terminal and the output node of said first differential amplifier and the gate connected to a first control signal,
a first and second current pass transistors with the channels connected in series between said output node and said ground voltage terminal and the gates respectively connected to the external source voltage dropped by a given value and said first control signal, and
a driving transistor with the channel connected between said external source voltage terminal and said internal source voltage terminal and the gate connected to said output node; and
second differential amplifying means comprising;
a second single-ended N-channel input differential amplifier with two input receiving said reference voltage and said internal source voltage,
an NMOS transistor with the channel connected between said external source voltage terminal and the output node of said second differential amplifier and the gate connected to said second control signal, and
a driving transistor with the gate connected to said output node and the channel connected between said external source voltage terminal and said internal source voltage terminal.

12. A source voltage control circuit as claimed in claim 11, wherein said reference voltage generating means further comprises:
a resistor and pull-down PMOS transistor connected in parallel between the drain of said PMOS transistor and said ground voltage terminal; and
current path means between said output node and said ground voltage terminal.

13. A source voltage control circuit as claim ed in claim 12, wherein said current path means comprises a plurality of diode-connected PMOS transistors.

14. A source voltage control circuit as claimed in claim 11, further comprising source voltage level sensing means connected between the gate of said first current path transistor and said external source voltage terminal.

15. A source voltage control circuit as claimed in claim 14, wherein said source voltage level sensing means comprises:
a plurality of diode-connected NMOS transistors connected in series between said external source voltage terminal and sensing node;
a resistor connected between said sensing node and said ground voltage terminal;
diode-connected NMOS transistors connected in series to said sensing node;
an NMOS transistor with the channel connected between said transistor and said ground voltage terminal and the gate connected to said first control signal;
a diode-connected NMOS transistor connected in series between said sensing node and said ground voltage terminal; and
an NMOS transistor with the gate connected to said first control signal.

16. A source voltage control circuit as claimed in claim 11, wherein said first and second current path transistors are NMOS type.

17. A source voltage control circuit as claimed in claim 16, wherein the driving transistors of said first and second differential amplifying means are PMOS.

18. A source voltage control circuit as claimed in claim 17, wherein the internal voltage slope at said internal source voltage terminal si controlled by adjusting the size of said first current path transistor when said external source voltage is equal to or greater than a specified value.

19. A source voltage control circuit as claimed in claim 11, wherein said first differential amplifying means is enabled by said first control signal of "high" state so as to perform active operation, while said second differential amplifying means is enabled by said second control signal of "low" state so as to perform stand-by operation.

20. A source voltage control circuit as claimed in claim 19, wherein said source voltage control circuit is changed form the active mode to the stand-by mode after a given delay time of said first control signal.

21. A source voltage control circuit as claimed in claim 20, wherein said first differential amplifying means is disabled when said driving transistor performs the stand-by operation.

22. A source voltage control circuit as claimed in claim 20, wherein said second differential amplifying means is disabled when said driving transistor performs the active operation.

23. A source voltage control circuit comprising:
reference voltage generating means;
plurality of differential amplifying means for active operation and a differential amplifying means for stand-by operation connected between an output node of said reference voltage generating means and internal source voltage terminals, respectively;
gating means with the channels respectively connected between the adjacent ones of said internal voltage terminals and the gates connected to a first control signal.

24. A source voltage control circuit as claimed in claim 23, wherein said gating means are PMOS transistors.

25. A source voltage control circuit as claimed in claim 24, wherein said gating means are turned off in active mode and turned on in stand-by mode.

* * * * *

UNITED STATES PATENT AND TRADEMARK OFFICE
CERTIFICATE OF CORRECTION

Page 1 of 4

PATENT NO. : 5,077,518
DATED : 31 December 1991
INVENTOR(S) : Gyo-Jin HAN

It is certified that error appears in the above-identified patent and that said Letters Patent is hereby corrected as shown below:

Column 1, Line 19, replace "much" with --often--;

Line 32, insert --a-- after "in";

Line 49, delete "a";

Column 2, Line 5, delete "a";

Line 53, replace "more" (first occurrence) with --a--;

Column 3, Line 21, delete "to";

Line 23, replace "becomes to have" with --arrives at--;

Line 35, replace "amplifier" with --amplifiers--;

Line 36, replace "to equal" with --equal to--;

Line 38, delete "on";

Line 46, delete "whole";

Line 50, replace "gets over" with --exceeds--;

Line 67, replace "maintained" with --kept--;

Column 4, Line 8, replace "gets over" with --exceeds--;

UNITED STATES PATENT AND TRADEMARK OFFICE
CERTIFICATE OF CORRECTION

PATENT NO. : 5,077,518

DATED : 31 December 1991

INVENTOR(S) : Gyo-Jin HAN

It is certified that error appears in the above-identified patent and that said Letters Patent is hereby corrected as shown below:

| | | |
|---|---|---|
| Column 5, | Line 44, | replace "transistor" (first occurrence) with --transistors--. |
| Column 6, | Line 3, | delete "a"; |
| | Line 4, | delete "a"; |
| | Line 10, | replace "transistors" with --transistor--; |
| | Line 28, | delete "an"; |
| | Line 29, | delete "a"; |
| Column 7, | Line 11, | replace "gets into" with --enters--; |
| Column 8, | Line 36, | replace "enough" with --sufficient--; |
| | Lines 61 and 62, | replace "maintained" with --stays--; |
| Column 9, | Line 5, | replace "s" with --so--; |
| | Line 9, | delete "more"; |
| | Line 15, | insert --at a-- after "maintained"; |
| | Line 33, | replace "becomes to have" with --develops--; |
| | Line 60, | replace "more operated" with --operated more--; |
| Column 10, | Line 4, | delete "a", and insert --and-- before "third"; |
| | Line 5, | replace "circuit" with --circuits--; |

UNITED STATES PATENT AND TRADEMARK OFFICE
CERTIFICATE OF CORRECTION

PATENT NO. : 5,077.518
DATED : 31 December 1991
INVENTOR(S) : Gyo-Jin HAN It is certified that error appears in the above-identified patent and that said Letters Patent is hereby corrected as shown below:

Column 10,     Line 27,   replace "is resulted in" with --results--;

Line 43,   delete "are separated", and insert --are separated-- after "lines";

Line 45,   delete "are connected";

Line 46,   insert --are connected-- after "lines";

Line 54,   replace "in the case that" with --when--;

Line 60,   replace "voltages" with --voltage--.

Claim 5,      Column 12,     Line 21,   replace "singly" with --single--;

Line 29,   replace "eight" with --eighth--, and replace "transistors" with --transistor--;

Claim 9,      Column 12,     Line 66,   replace "ius" with --is--;

Claim 11,     Column 13,     Line 27,   replace "transistors" with --transistor--.

Claim 13,     Column 13,     Line 61,   replace "claim ed" with --claimed--;

UNITED STATES PATENT AND TRADEMARK OFFICE
CERTIFICATE OF CORRECTION

PATENT NO. : 5,077,518
DATED : 31 December 1991
INVENTOR(S) : Gyo-Jin HAN It is certified that error appears in the above-identified patent and that said Letters Patent is hereby corrected as shown below:

Claim 18, Column 14, Line 28, replace "si" with --is--;

Claim 20, Column 14, Line 41, replace "form" with --from--.

Signed and Sealed this

Twenty-fifth Day of May, 1993

Attest:

MICHAEL K. KIRK

Attesting Officer

Acting Commissioner of Patents and Trademarks